United States Patent
Matt

(10) Patent No.: US 6,656,330 B2
(45) Date of Patent: Dec. 2, 2003

(54) COATING INSTALLATION FOR DISK-FORM WORKPIECES

(75) Inventor: Thomas Matt, Göfis (AT)

(73) Assignee: Unaxis Balzers Aktiengesellschaft, Furstentum (LI)

( * ) Notice: Subject to any disclaimer, the term of this patent is extended or adjusted under 35 U.S.C. 154(b) by 261 days.

(21) Appl. No.: 09/886,678

(22) Filed: Jun. 21, 2001

(65) Prior Publication Data

US 2002/0005165 A1 Jan. 17, 2002

(30) Foreign Application Priority Data

Jun. 22, 2000 (CH) .............................................. 1233/00

(51) Int. Cl.[7] .......................... C23C 14/34; C23C 16/00; B05D 1/00
(52) U.S. Cl. .............................. 204/192.1; 204/298.23; 204/298.25; 204/298.26; 204/298.27; 204/298.28; 427/445; 118/729; 118/730
(58) Field of Search .......................... 204/192.1, 298.23, 204/298.25, 298.26, 298.27, 298.28; 427/445; 118/729, 730

(56) References Cited

U.S. PATENT DOCUMENTS 4,670,126 A * 6/1987 Messer et al. .......... 204/298.25
5,709,785 A * 1/1998 LeBlanc et al. ........ 204/298.25
5,855,675 A * 1/1999 Doering et al. ............. 118/719
6,416,640 B1 * 7/2002 Schertler ............... 204/298.25

FOREIGN PATENT DOCUMENTS

DE 297 16 440 U1 1/1998 ........... C23C/14/34
DE 198 06 282 C1 3/1999 ........... C23C/14/56

OTHER PUBLICATIONS

European Search Report: Oct. 5, 2000—Balzers Aktiengesellschaft—SN 35049 SN.
European Search Report, dated Feb. 6, 2002.

* cited by examiner

Primary Examiner—Steven H. VerSteeg
(74) Attorney, Agent, or Firm—Notaro & Michalos P.C.

(57) ABSTRACT

A method for manufacturing a coated substrate disk, comprises linearly bringing the substrate on a mounting, into an evacuated transport chamber and rotating the mounting in the chamber. The mounting is then extended into a coating position and coating of the substrate takes place. The mounting is then linearly retracted into the chamber again and rotated into a position for guiding the substrate out of the chamber. These steps are repeated for several substrates and then a pump opening into the chamber is closed by means of the mounting or the substrate. The chamber is then flooded and vacuum-tightly closed and the pump opening is released. The chamber is evacuated and the substrate moving and coating steps are repeated for more substrates.

14 Claims, 2 Drawing Sheets

COATING INSTALLATION FOR DISK-FORM WORKPIECES

FIELD AND BACKGROUND OF THE INVENTION

The present invention builds on the task (1) to reduce in the case of coating installations, for example with virtually continuous 24-hour production operation, the shutdown times for maintenance, such as, for example, for replacing material sources consumed during the coating process or other installation parts such as coating masks. Therein (2) the coating installation should be constructionally as simple and compact as feasible.

Coating installations conventionally comprise a transport chamber, wherein, in the simplest case, workpieces are transported from an input/output lock station to a coating station. They are therein coated and subsequently transported back to the input/output lock station. Based on the requirement (2) for the simplest possible concept, a pump unit is provided via a pump opening on the transport chamber, which simultaneously handles the evacuation of the treatment station. Thus, in installations of this type the transport chamber is also flooded during the flooding of the treatment station. Otherwise the coating station would need to be compartmentalizable with respect to the transport chamber by employing a relatively complicated valve device.

A critical extension of the production shutdown times during the flooding of coating station and transport chamber results therefrom that, together with the transport chamber, at least portions of the pump unit flanged onto the pump opening are flooded. This leads, for one, to relatively long reconditioning times for the resumption of operation. For another, when, for example, turbovacuum pumps are provided on the pump unit, the latter would have to be compartmentalized against the flooding, which requires complicated and expensive compartmentalization valves.

SUMMARY OF THE INVENTION

The above cited task (1), namely minimizing shutdown times simultaneously with generating (2) as simple as feasible an installation configuration with high production rate, is realized through an installation according to the wording of claim 1.

Consequently, the coating installation according to the invention comprises a transport chamber with a workpiece transport configuration. The latter has at least two transport rams connected with a rotational axle driven under control, with transport rams, driven under control, which can be linearly extended and retracted. The transport rams are therein in the shell line of one and the same rotation body about the rotational axis and are, with respect to a given direction on the rotational axis, extendable and retractable in the same direction. Each ram bears at the end a workpiece receiver. On the transport chamber are furthermore provided at least two operating openings via which the transport chamber communicates with stations, of which one is a coating station. The surface normals of the clearance areas of said operating openings are therein oriented in the direction of shell lines of the rotation body.

Further provided on the coating installation according to the invention is a pump unit, communicating with the transport chamber via a pump opening, which is effective for the transport chamber as well as also for the coating station.

At least one of said rams has at the end a closure configuration or can be equipped therewith. In order to optimize the simple installation concept which, in all implementations of the coating installation according to the invention, permits extremely high production rates, also with respect to necessary production interruptions in connection with flooding, while maintaining the simple constructional concept, the pump opening is disposed on the chamber such that said ram can be oriented toward the pump opening, wherein the closure configuration, with orientation of said ram toward the pump opening and subsequently its moving, enters with the pump opening into an operational connection forming a sealed closure.

With respect to the fundamental structure of the transport chamber with said rams, reference is made in particular to EP 0 518 109 corresponding to U.S. Pat. No. 5,245,736 and to DE-GM 29 716 440 corresponding to U.S. Pat. No. 6,416,640.

In a first embodiment of the coating installation according to the invention the rotation body is a cylinder or a cone with an angle of aperture<90°, and said rams, correspondingly, can be extended and retracted under linear driving parallel or at an obtuse angle with respect to the rotational axis.

But in a preferred embodiment the rotation body is a special case of a cone, namely with a 90° aperture angle $\phi$, and the rams project radially from the rotational axis. The operating openings and the pump opening comprise therein surface normals which are in the rotational plane of the rams about the rotational axis.

Consequently, in the last mentioned, preferred embodiment the workpiece transport configuration has at least two transport rams projecting radially from a rotational axle driven under control and linearly extendable and retractable driven under control, which thus are in a plane perpendicular to the rotational axis. Again, at the end on each ram are provided corresponding workpiece receivers. Furthermore, in addition, at least two operating openings, now disposed with the surface normals of the clearance openings in said plane, are provided on the transport chamber, via which the latter communicates with stations, of which, furthermore, one is a workpiece coating station. As in all embodiments of the coating installation according to the invention, here also a pump unit is provided which, effective for the transport chamber as well as also for the coating station, communicates via a pump opening with the transport chamber.

As stated, the pump opening is disposed on the transport chamber such that at least one of said rams, preferably each, can be oriented toward it. At least one of said rams comprises the closure configuration or can be equipped therewith such that, with the orientation toward the pump opening by being moved, can here also enter with the pump opening into an operational connection forming a sealed closure.

If, in the preferred embodiment of the coating installation according to the invention, and with respect to the rotational axis, the rams are directed radially, the surface normal of the clearance area of the pump opening is consequently also disposed in the rotational plane of said rams.

While it is in principle known from DE 19 742 923 to close the pump opening to one pump unit for flooding a transport chamber, the transport chamber provided on the installation known therefrom, however, comprises as a workpiece transport configuration a solid carrier plate driven about a rotational axis, on whose one plate side, peripheral with respect to the rotational axis, the workpieces are positioned. By axial raising or lowering of the carrier plate, all workpieces, given the corresponding rotational angle orientation, are simultaneously moved toward or moved away with respect to the stations flanged onto the corresponding front face of the transport chamber wall. The plate surface opposing the transport surface of the carrier plate in the case of flooding of the transport chamber, acts onto a pump opening such that it closes it. This pump opening is disposed on the front face, with the front face of the transport chamber opposing the stations. This installation meets none of the requirements according to the task made of the installation according to the invention. For example it is evident:

- the lifting mechanism for the transport plate must be layed out such that in production it can not only supply the stations with workpieces, but, in the much rarer case, can also be retracted again for the purpose of closing the pump opening: the entire installation must be developed especially for this "rare" case alone.
- Since this additional lift can only be minimized within limits, namely to the extent that the pump effect is not to be choked through the transport plate in production position, this leads to structural enlargement and further complication of the overall installation.
- Relatively complex and expensive measures must be taken to develop the carrier plate, which is locally heat loaded due to the working, such that tight closing of the pump opening can be accomplished at any time and independently of the rotational position.
- The transport plate, which, for the reason stated, must occasionally be at relatively high mass, counteracts high production rates in so far as during the incremental rotation of this plate high inertial moments must be overcome, which requires correspondingly expensive drives for high production rates.

In a highly preferred embodiment of the coating installation according to the invention only two of the rams are provided which are disposed in said plane offset by 180° with respect to the rotational axis.

If the rotation body is a cylinder or a cone with an aperture angle less than 90°, said only two rams are disposed in a plane containing said rotational axis. In the case of the preferred embodiment, in which the rotation body is degenerated into a cone with an aperture angle of 90°, said provided two rams are disposed opposite with respect to the rotational axis and, in top view onto the rotational axis, offset by 180°, consequently also in said plane containing the rotational axis.

In any event, through the two-ram embodiment optimally deep masses to be moved with the transport configuration are realized, and it was found that the minimization of these masses, in view of the acceleration behavior of a rotation stepping drive provided for the transport configuration, is significantly more effective than a concept with more than two rams and a corresponding increase of the number of provided coating stations. Through this preferred embodiment, consequently, simultaneously with critical simplification of the installation within the scope of the task of the invention (2), optimization of productivity is attained. This is accomplished through the option of realizing the transport between the provided stations through rapid 180° rotational angle steps.

In a highly preferred manner therein are also provided only two of the stations, of which the one is a lock station and the two operating openings—to the lock station and to the coating station—are offset by 180° with respect to the rotational axis of the workpiece transport configuration.

If, as in the one of the preferred embodiments of the installation according to the invention, the rotation body is a cylinder or a cone with an aperture angle less than 90°, said operating openings are disposed such that the surface normals of its clearance openings are aligned with shell lines of said rotation body and specifically with shell lines which oppose one another offset by 180° with respect to the rotational axis, i.e. they lie in a plane which contains the rotational axis.

In the especially preferred embodiment of the installation according to the invention, in which the rotation body is degenerated to a cone with an aperture angle of 90°, said operating openings viewed in the direction of the rotational axis and, with respect to it, are disposed oppositely with radially directed surface normals.

In a preferred further development of the last cited embodiment, the pump opening between the operating openings and, with respect to them, is disposed preferably offset by 90°.

Consequently, in the one preferred embodiment of the installation according to the invention, in which the rotation body is a cylinder or a cone with an aperture angle less than 90°, the pump opening is again disposed such that its surface normal is aligned with shell lines of the corresponding rotation body, and it is preferably, viewed in the direction of the rotational axis offset by 90° with respect to the operating openings, disposed inbetween.

In the especially preferred embodiment the latter applies identically: in view onto the rotational axis, the surface normals, which are now directed radially, of the operating openings appear to be opposite offset by an angle of 180° with the pump opening offset with respect to it by 90° and disposed in-between.

Therewith, on the one hand, it is achieved that in production operation the pump effect is not impaired by the workpiece transport configuration; on the other hand, for the case of flooding through corresponding driving of the rotational drive alone for the workpiece transport configuration, a 90° —instead of 180° —rotational angle step can be initiated in order to bring one of the provided rams into an orientation toward the pump opening. Through the extension and retraction of the rams, provided in any event also for the production, the pump opening is closed or again released. Consequently, this does not require additional expenditures, since the ram under consideration carries out said pump opening-related lift also during the production with respect to the operating opening.

It is therein further preferred to dispose a supplemental opening in the wall of the transport chamber opposite, with respect to the rotational axis, to the pump opening such that in the plane, preferably each offset by 90°, four openings are provided. This supplemental opening can be employed for a multiplicity of different purposes. It can, for example, together with the closure of the pump opening, if required, also be closed, it can, when not in use, be closed with a cover, and, for example, be employed for service work of every type and/or for measuring workpiece parameters, such as for example for measuring coating distributions and/or coating thicknesses, etc.

Within the scope of as simple as feasible an installation concept (2), it is further preferably proposed that the interior volumes of the coating station and of the transport chamber are connected via a communication connection, not under control, i.e. without a controllable valve configuration being provided in such a connection. Consequently such a connection, as will yet be explained, is an uncontrolled bypass connection.

In a further highly preferred embodiment of the installation according to the invention the coating station provided is a sputter station.

Even though the closure configuration provided at the ends of the rams of the coating installation according to the invention can also be formed by disk-form workpieces themselves positioned thereon or by other members especially provided for this purpose, a further simplified concept is attained thereby that the workpiece receivers are formed by workpiece receiving plates, in each instance for at least one disk-form workpiece, and that this plate forms the closure configuration. In principle, on the provided workpiece receivers in each instance one disk-form, especially preferred circular disk-form workpiece, can be applicable so as to be centered with respect to the ram axis, or, grouped about said ram axis two or more disk-form workpieces, again clearly preferably circular disk-form workpieces.

Although it is further quite possible to provide on the coating installation according to the invention only one or only a portion of the provided ram with the required closure configuration—to orient the particular ram in the case of flooding toward the pump opening—in a highly preferred embodiment on all rams said closure configuration is provided and this, as stated, preferably also developed as a workpiece carrier plate. But therewith simultaneously the option is given of closing also the operating openings in production operation—as in flooding operation, the pump opening. If a lock station is provided, in this case said closure configuration on the ram oriented to the lock station acts directly as a lock valve and/or on the coating station said closure configuration of the ram, correspondingly oriented toward this station, separates the coating process from the transport chamber.

The installation according to the invention, in particular in its preferred two-ram/two station configuration, is in particular suitable for the fabrication of magnetic or optic storage disks, preferably optic storage disks, therein in particular for the fabrication of CDs of all types, be these normal factory-recorded CDs, CDRs or CDRWs.

BRIEF DESCRIPTION OF THE DRAWINGS

In the following the invention will be explained by example in conjunction with Figures. These depict.

DESCRIPTION OF THE PREFERRED EMBODIMENTS

Figure 1:
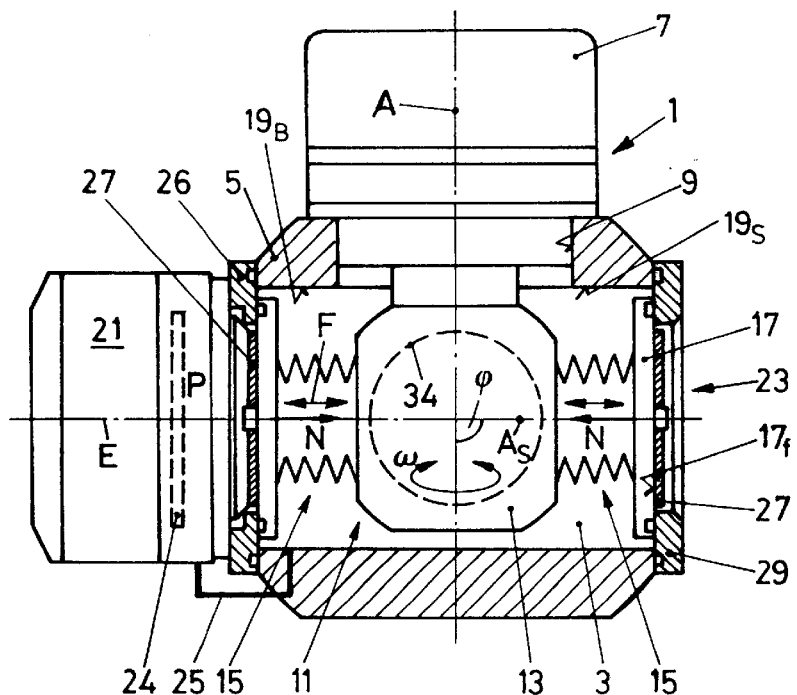
FIG. 1 schematically and simplified, a representation in partially sectioned view onto a coating installation according to the invention in the especially preferred embodiment, FIG. 2 in a representation analogous to FIG. 1, a further partially sectioned representation in a direction of view turned by 90° with respect to the representation of FIG. 1, FIG. 3 schematically a coating installation according to the invention in a further preferred embodiment, namely with cylindrical rotation body defined by the rotational motion of the ram, and FIG. 4 in a representation analogous to FIG. 3, a coating installation according to the invention with conical rotation body defined by the ram motion, with a cone aperture angle<90°.
Figure 2:
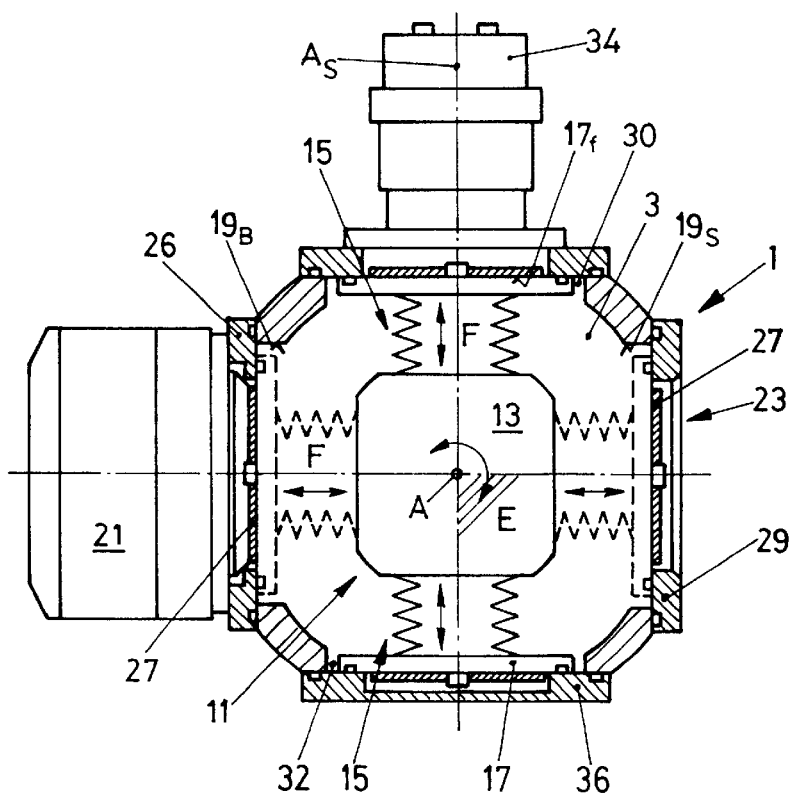

In FIGS. 1 and 2, the especially preferred coating installation according to the invention is shown, highly compact and conceptually simple, which leads to extremely short fabrication cycles.

The coating installation 1 according to the invention comprises a transport chamber 3. It is structured substantially rotationally symmetric with respect to an axis A. Onto one wall portion 5 of the transport chamber 3, substantially perpendicular to axis A, a controlled transport drive 7 is flanged, preferably a stepping drive. Via an opening 9 in said wall 5 it drives a transport configuration 11 provided in transport chamber 3. On an axle end 13 of drive 7, projecting into the transport chamber 3 are mounted two rams 15 opposing one another with respect to axis A and thus to the driving rotational axis. With respect to axis A, they are radially projecting in a plane E perpendicular to axis A. Upon its rotational motion ω about rotational axis A the rams 15 define a degenerated cone with a cone aperture angle φ=90°. Rams 15 comprise preferably, and as shown, bellows-encapsulated linear drives, by means of which each of the rams can be extended radially with respect to axis A or be retracted, independently of one another, as indicated by the double arrows F. If, with respect to the linear drives for the rams 15, independent drives are discussed, it means that they can be driven in any desired dependency from one another, thus also, for example, and preferably, synchronously.

At their ends, the rams 15 carry one workpiece receiving plate 17 each, whose plate surfaces 17f are perpendicular to the ram axes $A_S$.

In the wall of transport chamber 3 are disposed two operating openings. Onto the one, $19_B$, a sputter station 21 is flanged. On the other, $19_S$ a lock station 23 is realized.

The two openings $19_B$ and $19_S$ oppose one another with their central opening surface normals N on transport chamber 3; they are thus, as is readily evident in FIG. 2, offset with respect to the axis A by a rotational angle of 180° and with their central normal N, which according to FIG. 1 coincides with axis $A_S$, are also in plane E. Thus, the two openings $19_B$ and $19_S$ can each be served simultaneously by the rams 15, and therewith the particular provided stations 21 and 23, as is readily evident based on the ram position shown in dashed lines of FIG. 2.

In FIG. 1 is shown a target 24 on sputter station 21 schematically in dashed lines. A connection line 25 connects the sputter chamber process volume P with the interior of the transport chamber 3. It is understood that the connection line 25, shown schematically for reasons of clarity, is integrated, for example, into the flange 26 for mounting the sputter station 21 and/or into the wall of transport chamber 3, which is readily possible in particular since said bypass connection is not valve-controlled. Via this line 25 the interior volume of the transport chamber 3 and process volume of sputter station 21 communicate permanently and form, if desired, intentionally a pressure stage.

As is further evident, the workpiece receiving plate 17 acts on the particular ram 15 oriented to the lock station 23 as a lock valve facing the transport chamber. The lock station 23, realized essentially within the wall thickness of the transport chamber 3, for circular disk-form workpieces, in particular magnetic or optic storage disks, therein in particular optic storage disks, preferably CDs of all types, such as CDRs or CDRWs, 27 is (not shown) evacuated through a separate pump port into the minimized lock volume.

At the side of the atmosphere [pressure] the lock volume of the lock station 23 is closed by a schematically depicted lock valve 29 which is in contact on the outside.

Analogously, the workpiece receiving plate 17 with the correspondingly oriented ram 15 blocks the process volume P of the sputter station 21 with respect to the interior volume of the transport chamber 3, whereby the transport chamber is shielded from the process chamber.

As is further evident in the Figures, in plane E and (see in particular FIG. 2) offset in each instance by 90° with respect to the operating openings $19_S$ and $19_B$, on the wall of the transport chamber 3 one pump opening 30 is provided and, in a preferred embodiment of the pump opening 30, opposite with respect to axis A and furthermore in plane E, a further opening 32, which will be denoted as "service opening".

On pump opening 30 is mounted a pump unit 34 (indicated in dashed lines in FIG. 1), preferably comprising a mechanical molecular pump, such as in particular a turbovacuum pump, for example a turbomolecular pump and/or turbomolecular drag pump. If the service opening 32 is not needed or is only needed after the installation has been flooded, it is, as shown in FIG. 2, closed by means of a cover or a blind flange 36. Through this opening service work can be carried out or at this opening 32 measurements can be carried out manually and/or measurement transducers etc. can be installed (not shown).

As is in particular evident based on FIG. 2, one or both of the openings 30 or 32 can be closed thereby that the rams 15 during the production are not swivelled back and forth between the operating operations $19_B$ and $19_S$ by, in each instance, 180° rotational angle steps, but rather are moved into an intermediate position, offset by 90° with respect to said "operating positions". If for any reason, but in particular for a change of the target or the coating masks, the sputter station 21 as the coating station and thus, due to the connection 25, also the transport chamber 3 are to be flooded, the one of the rams 15 is swivelled into the intermediate rotational position shown in FIG. 2, and in particular the pump opening 30 is closed by applying the workpiece receiving plate 17 as a closure configuration. If required, and as also shown in FIG. 2, with the second ram 15 the service opening 32 can also be closed.

Thereby with an optimally simple and compact installation, the extremely compact and simple transport configuration, which is utilized in any event for production operation, with rams 15 is also employed for compartmentalizing the pump unit 34 during flooding.

With such a coating installation according to the invention a production cycle rate of, for example 2.5 seconds, is attained. This means that every 2.0 seconds a coated workpiece disk is transported out. For example, therein on the sputter station 21 after a production coating of 50,000 workpiece disks, a target change, and after a production coating of, for example 5,000 workpiece disks, a mask change must be carried out. Based thereon follows a necessary installation flooding approximately after three hours in each instance for a mask change, after 28 operating hours for a target change. The necessary time interval to run a pump unit with turbovacuum pump again up, is at least three minutes. Even though this time interval appears to be short, yet with a three-minute additional operating interruption of an installation without pump compartmentalization in the case of flooding, a roughly two percent productivity reduction results, which, given the above listed numbers, corresponds to a productivity loss of approximately 250,000 workpieces annually. Added to this is the shortening of the service life of the sensitive mechanical molecular pump, which is of particular importance. With the installation according to the invention, said additional operation interruption interval is no longer necessary and the pump reaches the best possible service life since it does not need to be run up and down again.

Figure 3:
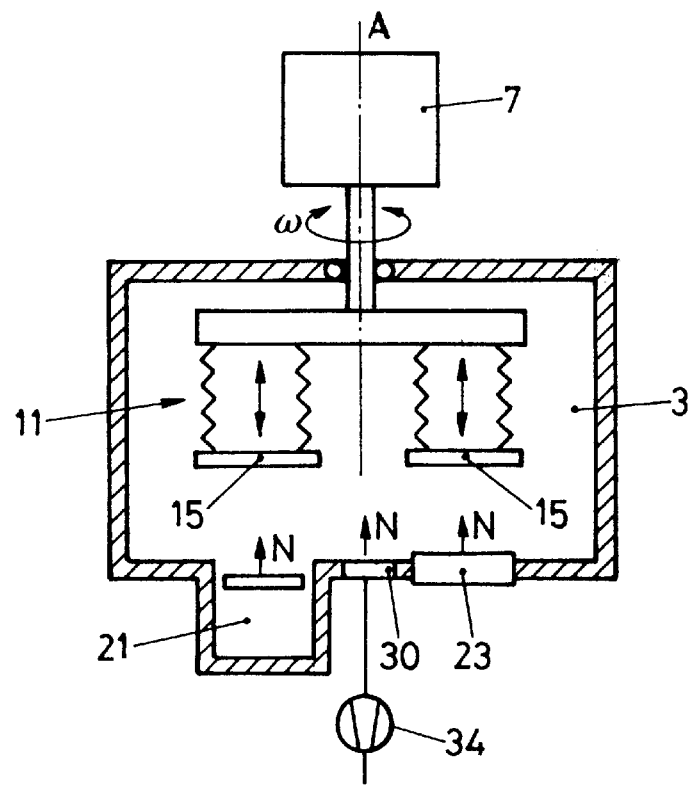

In FIG. 3 is shown schematically a further embodiment of the coating installation according to the invention. Its structure is readily comprehensible by a person skilled in the art based on the explanations offered so far. For functionally identical parts the same reference symbols are used, such as have already been employed in connection with the explanations in connection with FIGS. 1 and 2.

The two rams 15 are disposed parallel to the rotational axis A, in contrast to the especially preferred embodiment according to FIGS. 1 and 2. They consequently define a cylinder during their rotational motion $\omega$ about axis A. Preferably again two rams are provided disposed oppositely by 180° with respect to axis A, which rams act onto the stations 21 and 23 shown schematically. The center opening normals N of the clearance areas of the openings connecting the transport chamber 3 with stations 21 or 23, are oriented to the shell lines of the cylinder defined by the ram rotational motion. The pump opening 30 for pump unit 34 and the, if appropriate, provided service opening 32 (not shown) are disposed offset by 90° with respect to operating openings to stations 21 or 23 with identically oriented surface normals N.

Figure 4:
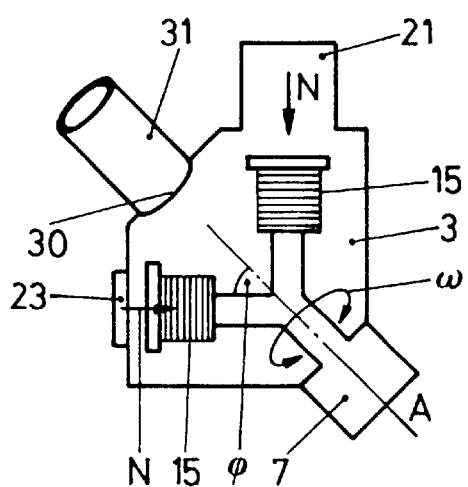

According to FIG. 4 the two rams define in their rotational motion about the rotational axis A a cone with a cone angle $\phi$ of less than 90°. Again, the center surface normals N of the clearance area of the operating openings to stations 21—preferably a sputter station—and 23—preferably a lock station—are oriented such that they are aligned with generating or shell lines of the cone defined by the rams 15 during their rotational motion. The same applies to the schematically shown pump opening 30, provided according to the invention, on which, for reasons of clarity, a pump port 31 is shown schematically in FIG. 4.

Here too, viewed in the direction of rotational axis A, the operating openings to stations 21 or 23 are preferably disposed offset by 180°, while the pump opening 30 and the possibly provided service opening (not shown) are disposed again offset by 90° with respect to the operating openings.

Consequently, with the installation according to the invention, on the one hand, an extremely high production rate is achieved, due to the simple installation developed only with small moving masses, on which the productivity is additionally optimized thereby that production shutdown times are significantly reduced. Due to the pump compartmentalization forming an essential part of the present invention, shutdown times for maintenance, such as for example and in particular target change and/or mask change, are minimized and reduced to those times which are, in practice, actually necessary for maintenance. Reconditioning times or time for running up the pump unit again become unnecessary.

What is claimed:

1. A method for manufacturing a coated disk-shaped substrate, comprising the steps of:
   (a) providing an evacuated transport chamber;
   (b) accepting a substrate on a mounting and bringing the substrate linearly into the transport chamber;
   (c) rotating the mounting with the substrate about a predetermined angle in the transport chamber;
   (d) linearly extending the mounting with the substrate into a coating position;
   (e) coating the substrate in the coating position;
   (f) linearly retracting the mounting with the substrate into the transport chamber;
   (g) rotating the mounting and the substrate into a position to be moved and guided linearly out of the transport chamber;
   (h) moving the substrate out of the transport chamber;
   (i) subsequently repeating steps (a) to (h) a plurality of times;
   (k) closing a pump opening on the transport chamber by means of at least one of the mounting and the substrate on the mounting;

(l) flooding the transport chamber;
(m) again vacuum-tightly closing the transport chamber;
(n) again releasing the pump opening;
(o) evacuating the transport chamber; and
(p) initiating steps (a) to (i) again.

2. A method according to claim 1, including:
providing the transport chamber (3) to have a workpiece transport configuration (11) comprises:
  at least two linearly extendable and retractable transport rams (15) driven under control and connected to a rotational axis (A) driven under control, which are within shell lines of a rotation body about the rotational axis (A) and, which can be extended and retracted in the same direction with respect to a direction on the rotational axis;
  a workpiece receiver (17) on an end of each ram (15);
  at least two operating openings ($19_B$, $19_S$) via which the transport chamber (3) communicates with stations (21, 23), of which one is a coating station, wherein surface normals (N) of the operating openings are directed in the direction of shell lines of the rotation body;
  a pump unit (34), communicating via a pump opening (30) with the transport chamber (3), for the transport chamber (3) as well as also for the coating station (21); and
  wherein at least one of the rams (15) comprises at its end a closure configuration (17) or can be equipped therewith, is orientable toward the pump opening and the closure configuration, and, with orientation of the ram (15) onto the pump opening (30) and subsequently its extension (F), enters into an operational connection forming a sealed closure;
  the coating of the substrate occurring in a coating station.

3. A method according to claim 2, including providing the rotation body to be a cylinder or a cone, and the rams being driven linearly, being extended and retracted parallel or obliquely to the rotational axis.

4. A method according to claim 2, wherein the rotation body is a cone with a 90° aperture angle, the rams projecting radially from the rotational axis (A) and the operating openings and the pump opening with their opening surface normals (N) are located in the rotational plane of the rams about the rotational axis.

5. A method according to claim 2, wherein the rams (15) are disposed offset by 180° with respect to the rotational axis (A), wherein also only two of the stations (21, 23) are provided, of which the one is a lock station (23) and the two operating openings ($19_B$, $19_S$) oppose one another with respect to the rotational axis (A).

6. A method according to claim 5, wherein the pump opening (30) is disposed in a plane (E) and, with respect to the rotational axis (A) and the operating openings ($19_B$, $19_S$) are offset by 90° between the latter, wherein further, opposing the pump opening (3) with respect to the rotational axis (A), a supplemental opening (32) is disposed in the wall of the transport chamber (3).

7. A method according to claim 2, wherein the coating station (21) and the transport chamber (3) are connected via a communication connection (25) not under control.

8. A method according to claim 2, wherein the coating station (21) is a sputter station.

9. A method according to claim 2, wherein the workpiece receiver is formed by a workpiece receiving plate (17) for at least one disk-shaped workpiece (27) as the substrate, and the plate (17) forms the closure member.

10. A method according to claim 2, wherein the closure configuration (17) is provided on all rams (15) and is developed as a workpiece carrier plate.

11. A method according to claim 10, wherein the closure configuration (17) with orientation of the particular ram (15) onto one of the operating openings (19) and its extending out (F) enters into an operational connection with the particular opening (19) forming a closure.

12. A method according to claim 2, wherein the closure configuration (17) is formed by a workpiece (27) placed onto the ram (15).

13. A method according to claim 2, for fabrication of magnetic or optic storage disks.

14. A method according to claim 13, for the fabrication of CDs.

* * * * *